US012749653B2

(12) United States Patent
Thome et al.

(10) Patent No.: US 12,749,653 B2
(45) Date of Patent: Sep. 29, 2026

(54) METHOD FOR SUPPLYING A LASER OR PLASMA WITH POWER, AND PLASMA OR LASER SYSTEM

(71) Applicant: TRUMPF Hüttinger GmbH + Co. KG, Freiburg (DE)

(72) Inventors: Christian Thome, Freiburg (DE); Ekkehard Mann, Gundelfingen (DE); Helmut Strycek, Reute (DE)

(73) Assignee: TRUMPF HÜTTINGER GMBH + CO. KG, Freiburg (DE)

( * ) Notice: Subject to any disclaimer, the term of this patent is extended or adjusted under 35 U.S.C. 154(b) by 102 days.

(21) Appl. No.: 18/907,707

(22) Filed: Oct. 7, 2024

(65) Prior Publication Data

US 2025/0191885 A1 Jun. 12, 2025

Related U.S. Application Data

(63) Continuation of application No. PCT/EP2023/059140, filed on Apr. 6, 2023.

(30) Foreign Application Priority Data

Apr. 8, 2022 (DE) ..................... 10 2022 108 631.3

(51) Int. Cl.
*H01J 37/32* (2006.01)
*H03F 3/60* (2006.01)

(52) U.S. Cl.
CPC ........ *H01J 37/32174* (2013.01); *H03F 3/602* (2013.01); *H03F 2200/198* (2013.01)

(58) Field of Classification Search
CPC ................ H01J 37/32174; H03F 3/602; H03F 2200/198
See application file for complete search history.

(56) References Cited

U.S. PATENT DOCUMENTS 7,362,530 B2 * 4/2008 Hashizume ......... H03F 3/45085 360/68
7,452,443 B2 11/2008 Gluck et al.
(Continued)

FOREIGN PATENT DOCUMENTS

DE 202010016850 U1 4/2011
DE 102011086557 B4 11/2014
(Continued)

OTHER PUBLICATIONS

Andre Grede et al., "High Power RF Amplifiers beyond 1 kW for Laser and Plasma Excitation," Oct. 2017, pp. 1-40, TRUMPF Huettinger GmbH + Co.KG, Freiburg im Breisgau, Germany.
(Continued)

*Primary Examiner* — Adam D Houston
(74) *Attorney, Agent, or Firm* — LEYDIG, VOIT & MAYER, LTD.

(57) ABSTRACT

A method includes providing a first power from an output terminal of a balanced amplifier to a discharge chamber. The balanced amplifier includes two amplifier paths, each of which supplies a signal to a coupler. The coupler is configured to combine the signals as a function of their phase relationship and supply a power as the first power to the output terminal and/or as a second power to an isolation terminal. The method further includes setting a first phase relationship between the signals for a predefined time in order to ignite the plasma, and setting a second phase relationship in order to maintain the plasma. Under the second phase relationship, substantially an entirety of the power is supplied to the output terminal. Under the first phase relationship, a third power reflected from the discharge chamber is reflected back to the discharge chamber in a proportion large enough for the ignition.

14 Claims, 2 Drawing Sheets

(56) References Cited

U.S. PATENT DOCUMENTS

| | | | |
|---|---|---|---|
| 7,512,387 B2 | 3/2009 | Glueck | |
| 7,745,955 B2 | 6/2010 | Kirchmeier et al. | |
| 8,792,198 B1 * | 7/2014 | Straub | G11B 5/6029 360/46 |
| 9,536,713 B2 * | 1/2017 | Van Zyl | H01J 37/32935 |
| 9,577,516 B1 * | 2/2017 | Van Zyl | H03F 3/245 |
| 10,026,593 B2 | 7/2018 | Alt et al. | |
| 10,224,184 B2 | 3/2019 | Van Zyl | |
| 10,404,224 B2 * | 9/2019 | Barton | H03F 1/565 |
| 12,231,090 B2 * | 2/2025 | Chen | H03F 1/42 |
| 12,456,607 B2 * | 10/2025 | Ramaswamy | H01J 37/32091 |
| 12,620,557 B2 * | 5/2026 | Yamagishi | H01J 37/3244 |
| 2003/0215373 A1 | 11/2003 | Reyzelman et al. | |
| 2009/0026181 A1 | 1/2009 | Kirchmeier et al. | |
| 2009/0149028 A1 | 6/2009 | Marakhtanov et al. | |
| 2010/0171427 A1 * | 7/2010 | Kirchmeier | H02M 7/5383 315/308 |
| 2012/0306564 A1 | 12/2012 | Thome et al. | |
| 2014/0239813 A1 * | 8/2014 | Van Zyl | H01J 37/32935 315/111.21 |
| 2015/0152833 A1 | 6/2015 | Mongin et al. | |
| 2016/0276138 A1 | 9/2016 | Van Zyl | |
| 2016/0299548 A1 | 10/2016 | Grede et al. | |
| 2017/0330731 A1 * | 11/2017 | Van Zyl | H01J 37/32183 |
| 2017/0359031 A1 * | 12/2017 | Haynes | H03F 3/604 |
| 2018/0323040 A1 | 11/2018 | Alt et al. | |
| 2019/0080886 A1 | 3/2019 | Kaplan | |
| 2019/0108976 A1 | 4/2019 | Van Zyl | |
| 2021/0159050 A1 | 5/2021 | Klimczak et al. | |
| 2021/0218375 A1 * | 7/2021 | Sharma | H03F 3/195 |
| 2022/0208519 A1 * | 6/2022 | Hasegawa | H01J 37/32183 |
| 2023/0101673 A1 * | 3/2023 | Ghanevati | H03F 3/211 330/296 |
| 2024/0365030 A1 * | 10/2024 | Watts | H04Q 11/0067 |
| 2025/0174438 A1 * | 5/2025 | Thome | H01J 37/32174 |
| 2025/0191885 A1 * | 6/2025 | Thome | H01J 37/32174 |
| 2025/0192727 A1 * | 6/2025 | Suda | H03F 1/0288 |
| 2025/0357906 A1 * | 11/2025 | Takenaka | H03F 1/0288 |
| 2026/0004995 A1 * | 1/2026 | Hasegawa | H01J 37/32146 |

FOREIGN PATENT DOCUMENTS

| | | | | |
|---|---|---|---|---|
| DE | 102013226537 A1 | | 6/2015 | |
| DE | 202017103327 U1 | * | 8/2017 | H01J 37/32 |
| EP | 2202776 A1 | | 6/2010 | |
| EP | 1516350 B1 | | 6/2012 | |
| EP | 3605582 A1 | | 2/2020 | |
| JP | 2025516110 A | * | 5/2025 | H03F 3/602 |
| KR | 20230100647 A | * | 7/2023 | H01J 37/32183 |
| WO | WO 2010091696 A1 | | 8/2010 | |
| WO | WO 2010091697 A1 | | 8/2010 | |
| WO | WO 2011110652 A1 | | 9/2011 | |
| WO | WO-2023194535 A1 | * | 10/2023 | H03F 3/602 |
| WO | WO-2024023157 A1 | * | 2/2024 | H01S 3/09702 |
| WO | WO-2024256588 A1 | * | 12/2024 | H01J 37/32183 |

OTHER PUBLICATIONS

Alexander Alt et al., "Improving the power evenness of power amplifiers using out-of-phase combining," 2015 European Microwave Conference (EuMC), Sep. 2015, pp. 1-4, IFEE, New York City, NY, USA.

Alexander Alt et al., "Analysis of high power LDMOS amplifiers for industrial applications under mismatch conditions," 2014 IEEE Topical Conference on Power Amplifiers for Wireless and Radio Applications (PAWR), Jan. 2014, pp. 1-3, IFEE, New York City, NY, USA.

Florian A. Maier et al., "A novel broadband high-power Source-Pull/ Load-Pull concept for the HF- to UHF-range," 2015 European Microwave Conference (EuMC), Sep. 2015, pp. 1-4, IFEE, New York City, NY, USA.

Christian Thome et al., "Plasma Power Supplies Inspired by Telecommunication Amplifiers," 60th Annual Technical Conference Proceedings, May 2017, pp. 1-5, Society of Vacuum Coaters, Albuquerque, NM, USA.

* cited by examiner

METHOD FOR SUPPLYING A LASER OR PLASMA WITH POWER, AND PLASMA OR LASER SYSTEM

CROSS REFERENCE TO RELATED APPLICATIONS

This application is a continuation of International Application No. PCT/EP2023/059140 (WO 2023/194535 A1), filed on Apr. 6, 2023, and claims benefit to German Patent Application No. DE 10 2022 108 631.3 filed on Apr. 8, 2022. The aforementioned applications are hereby incorporated by reference herein.

FIELD

Embodiments of the present invention relate to a method for supplying a laser or a processing plasma in a discharge chamber with electrical power. Embodiments of the invention also relate to a plasma or laser system, comprising a discharge chamber and a balanced amplifier.

BACKGROUND

A processing plasma, i.e. a plasma for processing workpieces, i.e. for example for etching or coating workpieces in an industrial plasma installation, in particular for fabricating semiconductors, is often excited by radiofrequency energy with frequencies of greater than or equal to 2 MHz and high power, e.g. greater than or equal to 3 kW, in a discharge chamber, also called plasma chamber. In order to ignite the plasma, it is known to apply the full operating power with an increased voltage to the plasma installation in order to achieve as rapid ignition of the plasma as possible. Such a radiofrequency energy is used in a comparable manner for supplying a laser in a discharge chamber. Such lasers are used e.g. for cutting and welding metal, glass, semiconductors and also for producing EUV light sources for lithography in semiconductor fabrication.

The radiofrequency energy is generated using amplifiers or inverters that are operated with transistors for amplifying a radiofrequency signal. Amplifiers are understood here to be amplifiers which operate predominantly in the linear region and in part in compression, i.e. typically those in the operating mode A, AB, B or C. Inverters are understood here to be inverters which operate predominantly in the switching mode, i.e. typically those in the operating mode D, E, F, inverse F (also for short: $F^{-1}$) or the like. Since the radiofrequency energy is often generated using amplifiers or inverters which are operated like an amplifier in the low power range and like an inverter in the high power range, the umbrella term "amplifiers" is used hereinafter for both types, inverters and amplifiers. Since the required powers are often higher than the powers which can be generated by a transistor, a pair of transistors, or else four transistors interconnected to form a full bridge, often a plurality of amplifiers are interconnected via a coupler that couples together the powers of the individual amplifiers. This is often done by means of power combiners having specific properties, so-called 3 dB couplers, also 90° couplers, quadrature couplers or hybrid couplers.

Such arrangements are distinguished by the fact that the amplifiers whose power is coupled together are operated with a phase offset of 90° during normal operation. The coupler is accordingly designed such that it couples together power to the output precisely when the power signals at the coupling inputs are phase-offset by 90°. Amplifiers coupled together in this way are usually referred to as "balanced amplifiers". If the power signals at the input of such a coupler are not phase-shifted by 90°, as a function of the phase angle a considerable portion of the power present at the inputs of the coupler is conducted to a compensation resistor connected via a fourth terminal, said resistor also being called a load compensation resistor, terminating resistor, compensation load or power dissipating device, and results in losses and evolution of heat there.

One problem for such balanced amplifiers often arises when there is an attempt to ignite the gas discharge. In the case of a balanced amplifier, the output power is flat, i.e. substantially constant, over the complex load plane. Power peaks (peaking) for ignition can be generated only with difficulty. Hitherto, it has been possible to achieve pseudo-peaking only by choosing a higher DC supply voltage. However, generating a higher DC supply voltage for the power peak is very complex.

DE 20 2017 103327 U describes an ignition method in which a higher power is attained at the output for ignition by virtue of the fact that the 90° condition of the quadrature coupler is set only for ignition and the amplifier actually configured as a "balanced amplifier" is really operated as a "balanced amplifier" with a 90° phase offset only in the ignition mode and is operated with a different phase angle during normal operation, which then has the consequence in this operating mode that only part of the power present at the inputs is coupled to the output and the remaining portion is coupled via the isolation terminal of the balanced amplifier into the compensation resistor, where it is converted into heat. This has proved to be a very lossy method. In particular, a deliberately controlled energy loss during normal operation, i.e. during working operation, has a very adverse effect on efficiency. That is not an acceptable method for higher powers.

SUMMARY

Embodiments of the present invention provide a method for supplying a laser or a processing plasma in a discharge chamber with electrical power. The method includes providing a first power from an output terminal of a balanced amplifier to the discharge chamber. The balanced amplifier includes at least two amplifier paths. Each respective amplifier path supplies a respective signal to a coupler. The coupler has the output terminal and an isolation terminal and is configured such that the coupler combines the signals of the at least two amplifier paths as a function of a phase relationship between the signals and supplies a power as the first power to the output terminal and/or as a second power to the isolation terminal as a function of the phase relationship between the signals. The method further includes setting a first phase relationship of the signals for a predefined time in order to carry out an ignition of the laser or of the plasma, and setting a second phase relationship different than the first phase relationship in order to operate the laser or to maintain the plasma in the discharge chamber. The second phase relationship is set such that the coupler supplies substantially an entirety of the power to the output terminal as the first power and supplies substantially no power to the isolation terminal, or the first phase relationship is set such that a third power reflected from the discharge chamber to the balanced amplifier is reflected back from the balanced amplifier to the discharge chamber in a proportion large enough for the ignition.

BRIEF DESCRIPTION OF THE DRAWINGS

Subject matter of the present disclosure will be described in even greater detail below based on the exemplary figures.

All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
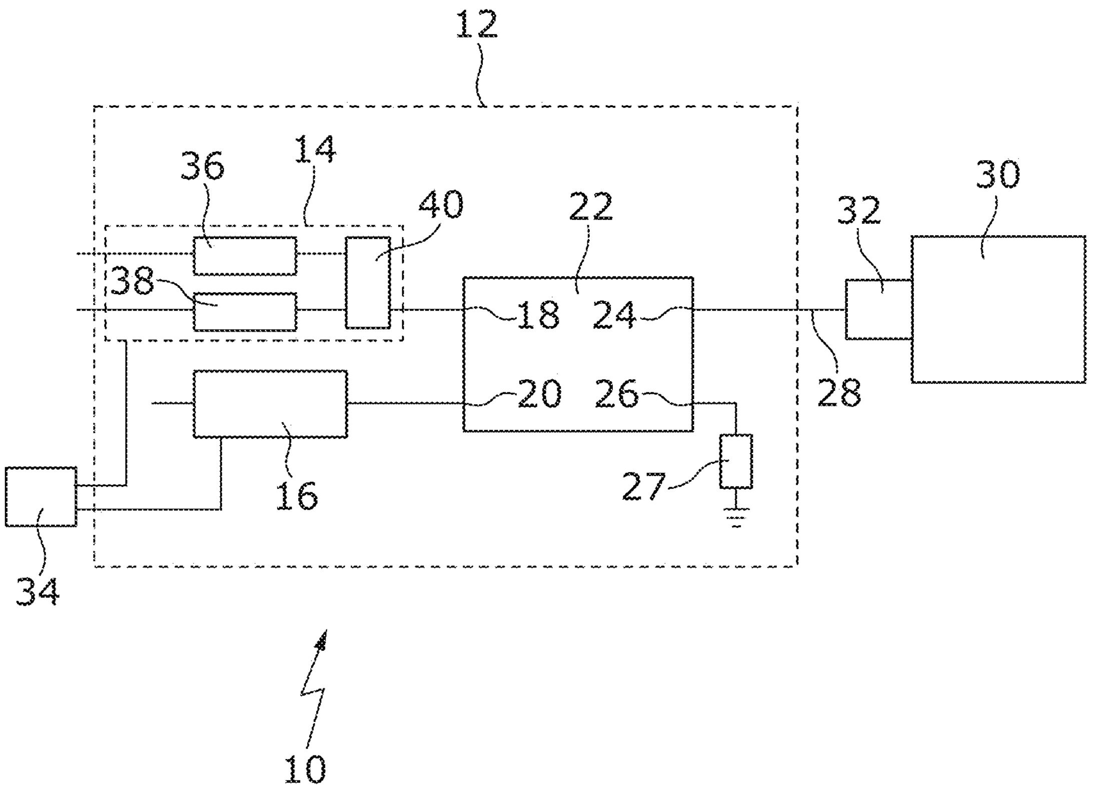
FIG. 1 shows a schematic illustration of a plasma system or of a laser system according to some embodiments.

Embodiments of the present invention provide a method and a device with which, when a balanced amplifier is used, reliable ignition of a laser or plasma can be achieved and at the same time the efficiency during normal operation can be kept high.

According to embodiments of the invention, a method for supplying a laser or a processing plasma in a discharge chamber with electrical power, wherein the method includes:

a. providing power from an output terminal of a balanced amplifier to the discharge chamber, wherein the balanced amplifier comprises at least two amplifier paths, each of which supplies a signal to a coupler, wherein the coupler has an output terminal and an isolation terminal and is configured such that it combines the signals as a function of their phase relationship and supplies power to the output terminal and/or the isolation terminal as a function of the phase relationship of the signals, b. setting a first phase relationship of the signals for a predefined time in order to carry out an ignition of the laser or of the plasma, c. setting a second phase relationship different than the first phase relationship in order to operate a laser or to maintain a plasma in the discharge chamber, i. wherein the second phase relationship is set such that the coupler supplies substantially the entire power to the output terminal and supplies substantially no power to the isolation terminal, or ii. the first phase relationship is set such that the power reflected from the discharge chamber to the balanced amplifier is reflected back from the balanced amplifier to the discharge chamber in a proportion large enough for the ignition.

"Substantially" here is taken to mean that, within the bounds of the tolerances of the coupler and the phase setting, what is tenable is done to attain these values. In this case, 5-10% of the power may well indeed be passed to the isolation terminal if a better setting is not achievable in an expedient way in the context of the amplifier. Embodiments of the invention accordingly provide for setting two different phase relationships between the signals fed to the coupler. A first setting serves to ignite the plasma or the laser, and the second setting serves to maintain the laser or the plasma. In this case, the first setting can advantageously be temporally shorter than the second setting. A phase relationship is in this case the phase angle or phase difference between the phases of two signals. A phase relationship can be changed for example by way of the phase of one or more signals being altered, such that the phase angle between two signals is different than before. In particular, the amplifier can be operated as or like an unbalanced amplifier by way of the described first setting in combination with the mismatch during ignition of the laser or plasma.

In the case of mismatch, in the case of the second setting, i.e. in the case of a balanced amplifier operated with a 90° phase offset, the power reflected from the discharge chamber is conducted back into the amplifiers via the output terminal of the coupler. The greatest proportion is reflected back again from said amplifiers. Owing to the opposite phase angle, however, this power reflected back is not conducted back to the output terminal and thus to the discharge chamber, but rather via the isolation terminal to the compensation resistor connected here. In this way, no power peaks arise on the line and at the plasma. That is highly desirable for normal operation and, therefore, balanced amplifiers operated at discharge chambers with their typically very high tendency to rapid unforeseeable alteration of the impedance and thus with relatively high proportions of reflected power, in particular during pulsed operation, are very popular with operators of the processing plasma or laser.

However, if the phase offset is adjusted, e.g. to 45°, in the case of mismatch, then the power reflected back from the amplifiers and the power generated by the amplifiers may be added together and power peaks may thus occur for specific mismatches. This is initially undesirable since it may result in instabilities during discharge operation. However, these power peaks can be advantageously used for ignition. It is therefore advantageous for this method if the unignited state is recognized or anticipated. Then, for the ascertained or anticipated duration of this state, the phase is correspondingly set such that ignition of the discharge is achieved. This is because for this period of time the power reflected from the discharge chamber to the balanced amplifier can thus be reflected back from the balanced amplifier to the discharge chamber in a proportion large enough for the ignition. In this case, as a disadvantageous effect, part of the generated power is also conducted via the isolation terminal to the compensation resistor connected here and is converted into heat. However, this setting and thus this state can be kept very short, and so the energy loss can be kept low. In a subsequent state of significantly longer duration, the phase can then be set to normal operation, namely 90°, in which the coupler supplies substantially the entire power to the output terminal and thus to the discharge chamber and supplies substantially no power to the isolation terminal. Power is then supplied to the output terminal only in the time period of the first state for ignition purposes, which is much more economical than the solution as proposed in DE 20 2017 103327 U.

This method can be used advantageously during pulsed operation with pulse frequencies of 10 kHz up to 500 kHz. Since the plasma in the discharge chamber is often completely extinguished in pulse pauses, the discharge has to be reignited for each new pulse. This can advantageously be done by the method described above.

The signals can have frequencies in the range of 1 MHz to 4000 MHz, in particular 1 MHz to 200 MHz. Moreover, they can have powers in the range of greater than or equal to 1 kW, in particular of 1 kW to 3000 kW, preferably of 1 to 3 kW.

The first phase relationship can be chosen such that there is a mismatch from the balanced amplifier to the plasma or to the laser or to the discharge chamber. In the case of mismatch, the power reflected at the discharge chamber is also reflected at the switching or amplifying element(s), in particular transistor(s), of the amplifier and is dissipated for the most part at a resistor connected to the isolation terminal. In the case of mismatch, setting the first phase relationship makes it possible to produce a superposition of the reflected power and the power generated by the amplifier. As a result, it is possible to produce a power which is greater than that produced in the normal case at a 50 ohm load. This power can be used to ignite the plasma or the laser.

The second phase relationship can be chosen such that more than 50% of the combined power, in particular more than 80% of the combined power, passes to the output terminal. This corresponds to normal operation, wherein the phase relationship of the signals is set such that as much power as possible is supplied to the output terminal.

The predefined time can be or chosen to be in the range of 0.1-10,000 μs, preferably in the range of 1-1000 μs. The first phase relationship can accordingly be set only for a relatively short period of time. This is sufficient to ignite the plasma or the laser.

As mentioned above, the power peaks attainable with the method can be established in particular for quite specific reflection factors. Reflection factors are generally complex and have a real part and an imaginary part. They can be represented e.g. in a Smith chart. A reflection factor is transformed on the length of a line. This is manifested e.g. graphically in the displacement in the Smith chart. Consequently, the length of the line between the balanced amplifier and the discharge chamber or an impedance matching device which can be disposed upstream of the discharge chamber can be used to positively influence the ignition for specific phase angles between the amplifier paths and specific reflections in the unignited state. The length of the line between the balanced amplifier and the discharge chamber or an impedance matching device which can be disposed upstream of the discharge chamber can be set such that the reflection factor of the unignited plasma or laser discharge is transformed such that the reflection factor seen by the balanced amplifier approaches a power peak, in particular corresponds thereto.

A 3 dB coupler, in particular a 90° hybrid coupler, can be used as the coupler. Two input signals phase-shifted by 90° can be combined by a 3 dB coupler, such that the combined power is output at the output terminal and no power is emitted at the isolation terminal. In this case, the amplifier paths that generate the signals can be decoupled and cannot mutually influence one another. A 3 dB coupler can itself ideally be lossless. This means that the power of the two amplifier paths can be fed completely to the load (plasma or laser) connected to the output terminal.

A phase angle of 90° between the signals can be set in order to maintain the plasma or laser. In conjunction with a 3 dB coupler, a maximum power can thus be passed to the plasma or the laser.

A phase angle of not equal to 90° between the signals can be set in order to ignite the plasma or laser, preferably a phase angle in the range of 5° to 85° or 95° to 175°, preferably in the range of 40° to 50° or in the range of 130° to 140°, preferably of 45° or 135°. A power peak can be generated in particular in the case of phases of 45° and 135°. These power peaks occur for example in the case of a reflection factor having an absolute value of greater than 0.8 and in the case of a phase of the reflection factor of −90° and 90°.

According to embodiments of the invention, a plasma or laser system includes:

a. a discharge chamber,
b. a balanced amplifier connected to the discharge chamber and comprising a coupler and at least two amplifier paths, each of which supplies a signal to the coupler, wherein the coupler has an output terminal and an isolation terminal and is configured such that it combines the signals as a function of their phase relationship and supplies power to the output terminal and/or the isolation terminal,
c. a controller designed to control the amplifier paths for setting a first phase relationship of the signals for igniting the plasma or laser in the discharge chamber and for setting a second phase relationship of the signals for maintaining the plasma or laser.

Such a system thus makes it possible to ignite a plasma or a laser even when a balanced amplifier is used.

An impedance matching device can be arranged between the discharge chamber and the balanced amplifier, wherein the impedance matching device is connected to the output terminal via a line having a length such that the load angle in the unignited state approaches the voltage peaks, in particular corresponds thereto. This measure makes it possible to support rapid ignition of the laser or plasma.

The coupler can be embodied as a 3 dB coupler, in particular a 90° hybrid coupler. Such a coupler is also known by the designation quadrature coupler. Such a coupler can in particular operate with low losses and combine a plurality of input signals to form an output signal having a higher power than each individual input signal.

At least one amplifier path can have a phase setting means, in particular a DDS (direct digital synthesis) component or an FPGA with a digital-to-analog converter (DAC), for phase setting of the phase of the signal output by the amplifier path. A phase relationship between the signals can thus be set in a simple manner.

However, the amplifier paths can also obtain their signals to be amplified via a splitter which sets the phase angle to 90°. This can be e.g. a 90° 3 dB splitter. In that case, too, a phase setting means can be provided for phase setting in at least one amplifier path.

The amplifiers can supply in particular signals at a frequency of 2 MHz to 60 MHz, in particular of 10 MHz to 16 MHz. This ignition behavior can be set well in this range.

The amplifier paths can each have in particular a class D, a push-pull, and/or a class F or an inverse class F ($F^{-1}$) inverter. Such an inverter can have in particular LDMOS transistors as switching and/or amplifying transistors. Inverters of this/these class(es) and/or having such transistors have proved to be suitable for such ignition operation and at the same time operate very stably and likewise economically during normal operation.

The following describes exemplary embodiments of the invention, with reference to the figures of the drawing. The various features can be realized individually by themselves or as a plurality in any desired combinations.

FIG. 1 shows a plasma or laser system 10. The plasma or laser system 10 comprises a balanced amplifier 12 having a first amplifier path 14 and a second amplifier path 16. The output signals of the first and second amplifier paths 14, 16 are passed to the input terminals 18, 20 of a coupler 22. The first and second amplifier paths 14, 16 are thus connected to the input terminals 18, 20 of the coupler 22. The coupler 22 has an output terminal 24 and an isolation terminal 26, to which a resistor 27 is connected. The resistor 27 is also referred to as compensation resistor. A discharge chamber 30 is connected to the output terminal 24 via a line 28. The line length of the line 28 can be set. An impedance matching device 32 is arranged directly at the discharge chamber 30. In the exemplary embodiment shown, the discharge chamber 30 is thus connected to the balanced amplifier 12 via the line 28 and the impedance matching device.

Such amplifier topologies having this type of coupler are described for example in the following publications: U.S. Pat. Nos. 7,512,387B2, 7,452,443B, 7,745,955B2, 10,026,593B2, DE 20 2017 103327 U, WO2011/110652 A1, DE 10 2011 086557 B4.

In particular, in U.S. Pat. No. 10,026,593B2 and the corresponding DE10 2013 226537 A1, FIG. 9 shows the difference in the measured output power versus the complex reflection factor for an unbalanced amplifier (non-phase-shifting coupler unit, upper graph) and for a balanced amplifier (with 90° hybrid coupler, lower graph). It is clearly discernible in the lower graph that the maximum power is output at the 50Ω point in the center of the graph, and the power decreases slowly as the reflection factor increases. By contrast, the upper graph of the unbalanced amplifier reveals that the maximum power is not output at the 50Ω point in the center of the graph. In the case of mismatch in the direction $\varphi=11\pi/6$, a significantly higher power is output. A power peak arises here. That is similar to how it is achieved in this application with a balanced amplifier, i.e. with a 90° hybrid coupler, but with an altered phase angle between the amplifier paths. Therefore, it is also mentioned here that the amplifier is operated as or like an unbalanced amplifier by way of the described first setting in combination with the mismatch during ignition of the laser or plasma.

DE 10 2011 086557 B4 and WO2011/110652 A1, in particular, show how more than two amplifier paths can also be interconnected to form arrangements with high power. In that case, it is not absolutely necessary for all the couplers to be embodied as 90° hybrid couplers, as shown in WO2011/110652 A1. An arrangement as in FIG. 4 or FIG. 5 of WO2011/110652 A1 has proved to be advantageous.

The coupler 22 is configured so that the signals arriving at the inputs 18, 20 are coupled to one another as a function of their phase relationship and passed to the output terminal 24 and/or the isolation terminal 26. For normal operation, i.e. in order to maintain a plasma or a laser in the discharge chamber 30, a phase relationship between the signals arriving at the inputs 18, 20 is set which has the effect that the signals are coupled by the coupler 22 such that a maximum power is output at the output terminal 24 and ideally no power is output at the isolation terminal 26. That is usually 90°.

The amplifier paths 14, 16 can be controlled by way of a controller 34. In particular, the phase and/or amplitude of the signals output by the amplifier paths 14, 16 can be set by the controller 34. A phase relationship between the signals can thus be set.

It is conceivable for there to be present even further amplifier paths 14, 16 connected to the coupler 22. In the exemplary embodiment shown, the amplifier path 14 itself again has amplifier paths 36, 38, the output signals of which are combined by the coupler 40. The output signal of the coupler 40 corresponds to the output signal of the amplifier path 14.

Each of the amplifier paths 16, 36, 38 can in turn be set up analogously to the amplifier path 14. It is also possible for only some amplifier paths to be set up like the amplifier path 14. The amplifier paths 14, 16, 36, 38 can be controlled by the controller 34. In particular, the amplifier paths 14, 16, 36, 38 can have phase setting means, for example a DDS component, or an FPGA with a DAC connected downstream, by means of which the phase of the output signal of the respective amplifier path 14, 16, 36, 38 can be set.

Figure 2:
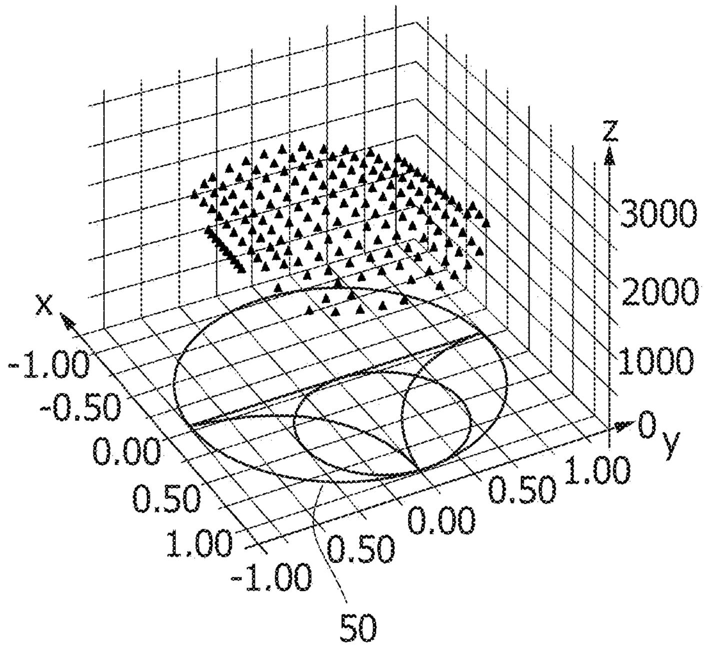
FIG. 2 shows the output characteristic of a balanced amplifier over the load plane during normal operation, according to some embodiments.

FIG. 2 shows the load plane 50 in the form of a Smith chart. The real part of the reflection factor is plotted on the x-axis and the imaginary part of the reflection factor is plotted on the y-axis. The output power is indicated on the z-axis. It is evident here that the output power at the output terminal 24 is virtually constant. The result therefore is a flat output power characteristic over the load plane 50. In particular, no power peaks are discernible. The output characteristic shown corresponds to the characteristic of a balanced amplifier in which a phase relationship between the input signals is set which leads to a maximum power coupling at the output terminal 24. The figure shown was produced with a balanced amplifier which has a 3 dB coupler as coupler and in which the input signals are phase-shifted by 90°. This corresponds to the setting of a second phase relationship for normal operation, i.e. in order to maintain a plasma or to operate a laser.

Figure 3:
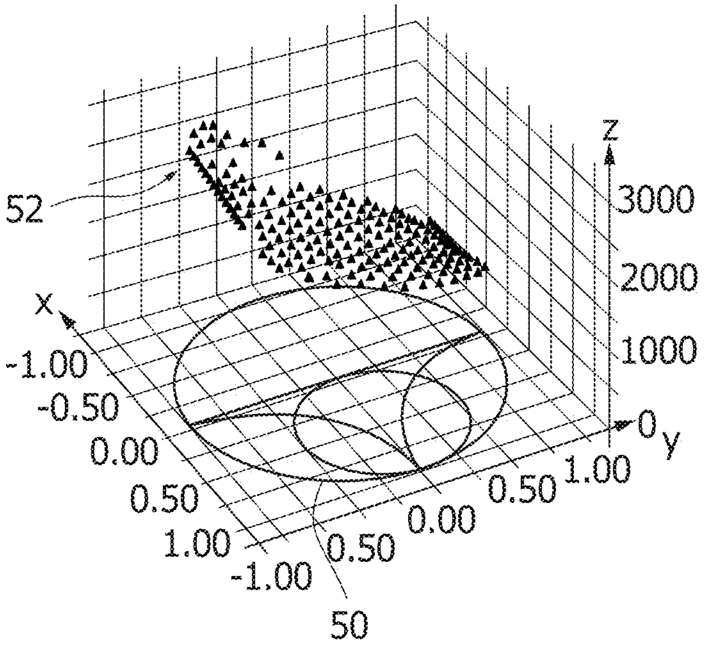
FIG. 3 shows the output characteristic of the output power of an amplifier when a first phase relationship is set, according to some embodiments.

FIG. 3 shows the output power characteristic over the load plane 50 when a first phase relationship or amplitude relationship which deviates from the setting in normal operation for maintaining the plasma or laser is set between the input signals. It is evident that a substantially flat power distribution was not attained, rather that power peaks occur in the region 52. In particular, here by way of example it was possible to generate a maximum power of more than 3200 W in the case of an absolute value of the reflection factor of approximately 0.8 and an angle of the reflection factor of approximately 110°. In the previous example, in the case of a 50 ohm load, a power of approximately 2300 W was generated, and a maximum power of more than 2400 W in the case of an absolute value of the reflection factor of approximately 0.8 and an angle of the reflection factor of approximately 105°.

The power peaks in the region 52 can be used to achieve ignition of the plasma or laser.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article “a” or “the” in introducing an element should not be interpreted as being exclusive of a plurality of elements. Likewise, the recitation of “or” should be interpreted as being inclusive, such that the recitation of “A or B” is not exclusive of “A and B,” unless it is clear from the context or the foregoing description that only one of A and B is intended. Further, the recitation of “at least one of A, B and C” should be interpreted as one or more of a group of elements consisting of A, B and C, and should not be interpreted as requiring at least one of each of the listed elements A, B and C, regardless of whether A, B and C are related as categories or otherwise. Moreover, the recitation of “A, B and/or C” or “at least one of A, B or C” should be interpreted as including any singular entity from the listed elements, e.g., A, any subset from the listed elements, e.g., A and B, or the entire list of elements A, B and C.

The invention claimed is:

1. A method for supplying a laser or a processing plasma in a discharge chamber with electrical power, the method comprising:

providing a first power from an output terminal of a balanced amplifier to the discharge chamber, wherein the balanced amplifier comprises at least two amplifier paths, each respective amplifier path supplies a respective signal to a coupler, wherein the coupler has the output terminal and an isolation terminal and is configured such that the coupler combines the signals of the at least two amplifier paths as a function of a phase relationship between the signals and supplies a power as the first power to the output terminal and/or as a second power to the isolation terminal as a function of the phase relationship between the signals, setting a first phase relationship between the signals for a predefined time in order to carry out an ignition of the laser or of the plasma, and setting a second phase relationship different than the first phase relationship in order to operate the laser or to maintain the plasma in the discharge chamber, wherein the second phase relationship is set such that the coupler supplies substantially an entirety of the power to the output terminal as the first power and supplies substantially no power to the isolation terminal, and the first phase relationship is set such that the coupler supplies a portion of the power to the isolation terminal as the second power, and a third power reflected from the discharge chamber to the balanced amplifier is reflected back from the balanced amplifier to the discharge chamber in a proportion large enough for the ignition.

2. The method as claimed in claim 1, wherein the first phase relationship is chosen such that there is a mismatch from the balanced amplifier to the discharge chamber.

3. The method as claimed in claim 1, wherein the predefined time is in a range of 0.1-10,000 microseconds.

4. The method as claimed in claim 1, wherein the coupler comprises a 3 dB coupler.

5. The method as claimed in claim 1, wherein a phase angle of 90° between the signals is set in order to maintain the plasma.

6. The method as claimed in claim 1, wherein a phase angle of not equal to 90° between the signals is set in order to ignite the plasma.

7. A plasma system comprising a discharge chamber, a balanced amplifier connected to the discharge chamber, the balanced amplifier comprising a coupler and at least two amplifier paths, each respective amplifier path supplies a respective signal to the coupler, wherein the coupler has an output terminal and an isolation terminal and is configured such that the coupler combines the signals of the at least two amplifier paths as a function of a phase relationship between the signals and supplies a power as a first power to the output terminal and/or as a second power to the isolation terminal, a controller configured to control the at least two amplifier paths for setting a first phase relationship between the signals for igniting a plasma in the discharge chamber and for setting a second phase relationship between the signals for maintaining the plasma, wherein the second phase relationship is set such that the coupler supplies substantially an entirety of the power to the output terminal as the first power and supplies substantially no power to the isolation terminal, and wherein the first phase relationship is set such that the coupler supplies a portion of the power to the isolation terminal as the second power, and a third power reflected from the discharge chamber to the balanced amplifier is reflected back from the balanced amplifier to the discharge chamber in a proportion large enough for the ignition.

8. The plasma system as claimed in claim 7, wherein the coupler comprises a 3 dB coupler.

9. The plasma system as claimed in claim 7, wherein at least one amplifier path of the at least two amplifier paths comprises a phase setting device for setting the phase relationship between the signals of the at least two amplifier paths.

10. The method as claimed in claim 1, wherein the coupler comprises a 90° hybrid coupler.

11. The method as claimed in claim 6, wherein the phase angle between the signals is in a range of 5°-85° or in a range of 95°-175°.

12. The method as claimed in claim 6, wherein the phase angle between the signals is in a range of 40°-50° or in a range of 130°-140°.

13. The plasma system as claimed in claim 7, wherein the coupler comprises a 90° hybrid coupler.

14. The plasma system as claimed in claim 9, wherein the phase setting device comprises a direct digital synthesis (DDS) component or a field programmable gate array (FPGA) with a digital-to-analog converter (DAC).

* * * * *